（12） United States Patent
Chang et al.

(10) Patent No.: US 7,639,079 B2
(45) Date of Patent: Dec. 29, 2009

(54) TECHNIQUES FOR DESIGNING WIDE BAND LOW NOISE AMPLIFIERS

(75) Inventors: Tienyu Chang, Gainesville, FL (US); Jinghong Chen, Basking Ridge, NJ (US)

(73) Assignee: Agere Systems Inc., Allentown, PA (US)

( * ) Notice: Subject to any disclaimer, the term of this patent is extended or adjusted under 35 U.S.C. 154(b) by 94 days.

(21) Appl. No.: 11/673,264

(22) Filed: Feb. 9, 2007

(65) Prior Publication Data

US 2007/0120603 A1    May 31, 2007

(51) Int. Cl.
  $H03F\ 3/45$    (2006.01)
(52) U.S. Cl. .................................... 330/260; 330/292
(58) Field of Classification Search ................ 330/260, 330/294, 292, 282
  See application file for complete search history.

(56) References Cited

U.S. PATENT DOCUMENTS

| | | | |
|---|---|---|---|
| 3,593,174 A | 7/1971 | White | |
| 3,940,706 A | 2/1976 | Stegens | |
| 4,401,952 A | 8/1983 | Basawapatna | |
| 4,525,678 A | 6/1985 | Lehmann et al. | |
| 5,051,705 A * | 9/1991 | Moghe et al. | ............... 330/277 |
| 5,256,991 A | 10/1993 | Campbell et al. | |
| 5,412,347 A | 5/1995 | Minnis | |
| 5,726,613 A | 3/1998 | Hayashi et al. | |
| 6,005,441 A * | 12/1999 | Kawahara | ................... 330/294 |
| 6,028,496 A | 2/2000 | Ko et al. | |
| 6,118,978 A | 9/2000 | Ihmels | |
| 6,320,462 B1 | 11/2001 | Alley | |
| 6,515,560 B1 | 2/2003 | Adan | |
| 6,541,993 B2 | 4/2003 | Laureanti | |
| 6,737,944 B2 | 5/2004 | Kunikiyo | |
| 6,784,749 B1 | 8/2004 | Cove | |
| 6,906,599 B2 | 6/2005 | Lu | |
| 6,949,979 B2 | 9/2005 | Lu et al. | |
| 7,042,317 B2 | 5/2006 | Xiao et al. | |
| 7,049,888 B2 | 5/2006 | Soda | |
| 7,109,793 B2 * | 9/2006 | Nakatani et al. | ............ 330/252 |
| 7,256,646 B2 * | 8/2007 | Eid et al. | ..................... 327/563 |
| 7,415,286 B2 * | 8/2008 | Behzad | .................... 455/553.1 |
| 2002/0118034 A1 | 8/2002 | Laureanti | |
| 2004/0111681 A1 | 6/2004 | Lu et al. | |
| 2004/0119556 A1 | 6/2004 | Lu | |
| 2005/0282503 A1 | 12/2005 | Onno et al. | |
| 2006/0001492 A1 | 1/2006 | Chang et al. | |
| 2006/0044099 A1 | 3/2006 | Gill | |

* cited by examiner

*Primary Examiner*—Robert Pascal
*Assistant Examiner*—Hieu P Nguyen
(74) *Attorney, Agent, or Firm*—Ryan, Mason & Lewis, LLP

(57) ABSTRACT

A wideband amplifier having an amplifier input terminal and an amplifier output terminal includes at least one transistor coupled to the amplifier input terminal and an impedance element coupled between the amplifier input terminal and the amplifier output terminal. A feedback signal is transmitted between the amplifier output terminal and the amplifier input terminal by way of the impedance element wherein the feedback signal varies in accordance with changes in an impedance of the impedance element so as to peak a frequency response of the amplifier.

35 Claims, 11 Drawing Sheets

TECHNIQUES FOR DESIGNING WIDE BAND LOW NOISE AMPLIFIERS

BACKGROUND OF THE INVENTION

1. Field of Invention

This invention relates to in the field of amplification of high frequency communications signals.

2. Description of Related Art

Low Noise Amplifiers (LNAs) are well known in the art of amplifying weak signals in wireless communications systems. For example, LNAs were used in telephone systems including time division multiple access (TDMA) systems and code division multiple access (CDMA) systems. Since these systems were primarily directed to low data rate voice transmissions relatively narrow bandwidth amplifiers were adequate. For example, the frequency bandwidths that were amplified in these systems typically extended only to approximately 5 MHz.

However, wide band LNAs are becoming increasingly important for a number of reasons. One reason is the fact that a new ultra-wide band (UWB) standard covering the range of approximately 3 GHz to 10 GHz has come into effect. See. The new standard was mainly directed to high data rate wireless transmissions. Furthermore, wide band LNAs could be applied to many of the popular new hand held and non hand held devices. Another reason LNAs became increasingly important was the fact they could be applied to the antennas of many devices for receiving and processing weak signals. For example, multimode receivers and software defined radio could require wide band LNAs in order to amplify the weak signals from their antennas.

Therefore, in order to comply with the new standards UWB LNAs were required to meet much more demanding specifications. Complying with the new standards required designers to extend the bandwidth of LNAs in the areas of input impedance matching, noise figure, gain and linearity. Chip areas were required to be small in order to reduce the cost of manufacturing the LNAs. Additionally, since UWB LNAs could be used in battery powered applications such as hand held devices it was preferable that they have low power requirements.

It was known to use both input matching networks and output load bandwidth extension techniques in attempting to meet these requirements. For example, it was known to use multistage input matching networks to attempt to obtain the input matching suitable for the bandwidths required in the new applications. In this manner, a bandpass response of several octaves could be achieved. However, several inductors were required to implement the multistage matching networks filters that were suitable for the new standards. Furthermore, in cases where higher order matching networks were required, additional inductors were needed. Since inductors can occupy a large chip area, multistage filters using the foregoing inductors were often too large and expensive to manufacture economically.

It was also known to use distributed amplifiers in an attempt to obtain the wide required bandwidth. However, distributed amplifiers required the cascading of multiple stages of amplifiers and the use many inductors. Furthermore, multiple stages of amplifiers required large power consumption and inductors required a lot of chip area. These two drawbacks made the distributed amplifier unsuitable for designing wide band LNAs.

Additionally, it was known to add an inductor to the output load of an LNA in order to extend the gain bandwidth of LNAs. However, the load inductors used in this manner were undesirably large, as previously described. In another attempt to meet the new standards, resistive feedback was provided at the drain and gate nodes of the input transistors of the LNAs to improve input impedance matching and extend bandwidth. However, none of the known techniques for designing UWB LNAs could meet all of the specifications required for the new standards economically.

BRIEF SUMMARY OF THE INVENTION

A wideband amplifier having an amplifier input terminal and an amplifier output terminal includes at least one transistor coupled to the amplifier input terminal and an impedance element coupled between the amplifier input terminal and the amplifier output terminal. A feedback signal is transmitted between the amplifier output terminal and the amplifier input terminal by way of the impedance element wherein the feedback signal varies in accordance with changes in an impedance of the impedance element so as to peak a frequency response of the amplifier.

An amplifier circuit having an amplifier input terminal includes an input signal to be amplified by the amplifier circuit wherein the input signal is received by the amplifier input terminal. The amplifier circuit also includes an input transistor having a transistor input terminal. An input inductor coupled to the amplifier input terminal and to the transistor input terminal wherein the input inductor receives the input signal from the amplifier input terminal and applies the input signal to the transistor input terminal is recited. A transistor feedback loop is coupled to the input transistor to provide transistor feedback wherein the transistor feedback loop includes the input inductor.

A differential amplifier circuit includes first and second input transistors each having a gate and a drain and, first and second input signals to be amplified by the differential amplifier circuit, wherein the first and second input signals are received by the gates of the first and second input transistors. First and second capacitors are included wherein each of the first and second capacitors couples the gate of one of the first and second input transistors to the drain of the other of the first and second input transistors.

An RF amplifier circuit having an amplifier input terminal and an amplifier output terminal includes an RF input signal to be amplified wherein the RF input signal is received by the amplifier input terminal. An amplifier RF output signal is provided at the amplifier output terminal in accordance with the RF input signal. An active inductor is coupled to the amplifier output terminal.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

The invention will be illustrated in more detail with reference to the following description. However, it should be understood that the present invention is not deemed to be limited thereto.

Figure 1:
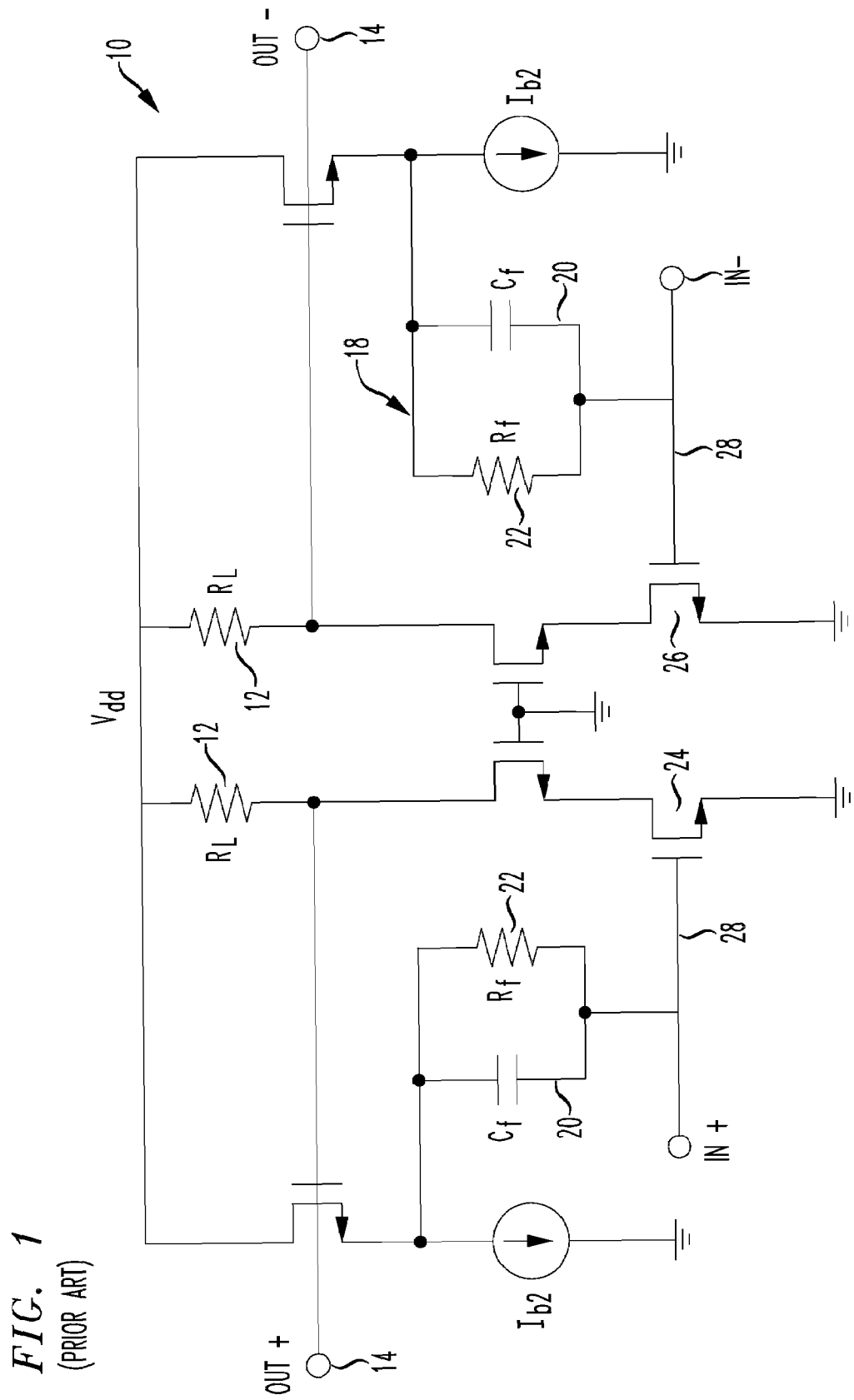
FIG. 1 is a schematic representation of a known amplifier circuit for resistive feedback amplification of communications signals.

Referring now to FIG. 1, there is shown a schematic representation of a known resistive feedback amplifier circuit 10 for amplifying communications signals. In the amplifier circuit 10 a differential input signal could be applied to the differential input terminals 28. The differential input signal could thereby be applied to the input transistors 24, 26 for amplification. The input transistors 24, 26 were preferably provided with the feedback loops 16, 18, respectively. The feedback loops 16, 18 typically included the feedback resistors 22 for input matching purposes to thereby extend the bandwidth of the circuit 10. The feedback capacitors 20 could also be provided in the feedback loops 16, 18 in parallel with the feedback resistors 22 in order to further extend the bandwidth.

The parallel combinations of the resistors 22 and the capacitors 20 were thus effective to somewhat extend the bandwidth of the amplifier circuit 10. It was believed that the improved frequency response obtained in this manner was due to the fact that the parallel capacitors 20 could reduce the effective feedback resistance at higher input frequencies, where the small signal gain is smaller than it is at lower frequencies. The amplified output signals of the amplifier circuit 10 appeared at the output terminals 14 of the amplifier circuit 10 and were applied to the amplifier load 12.

Figure 2:
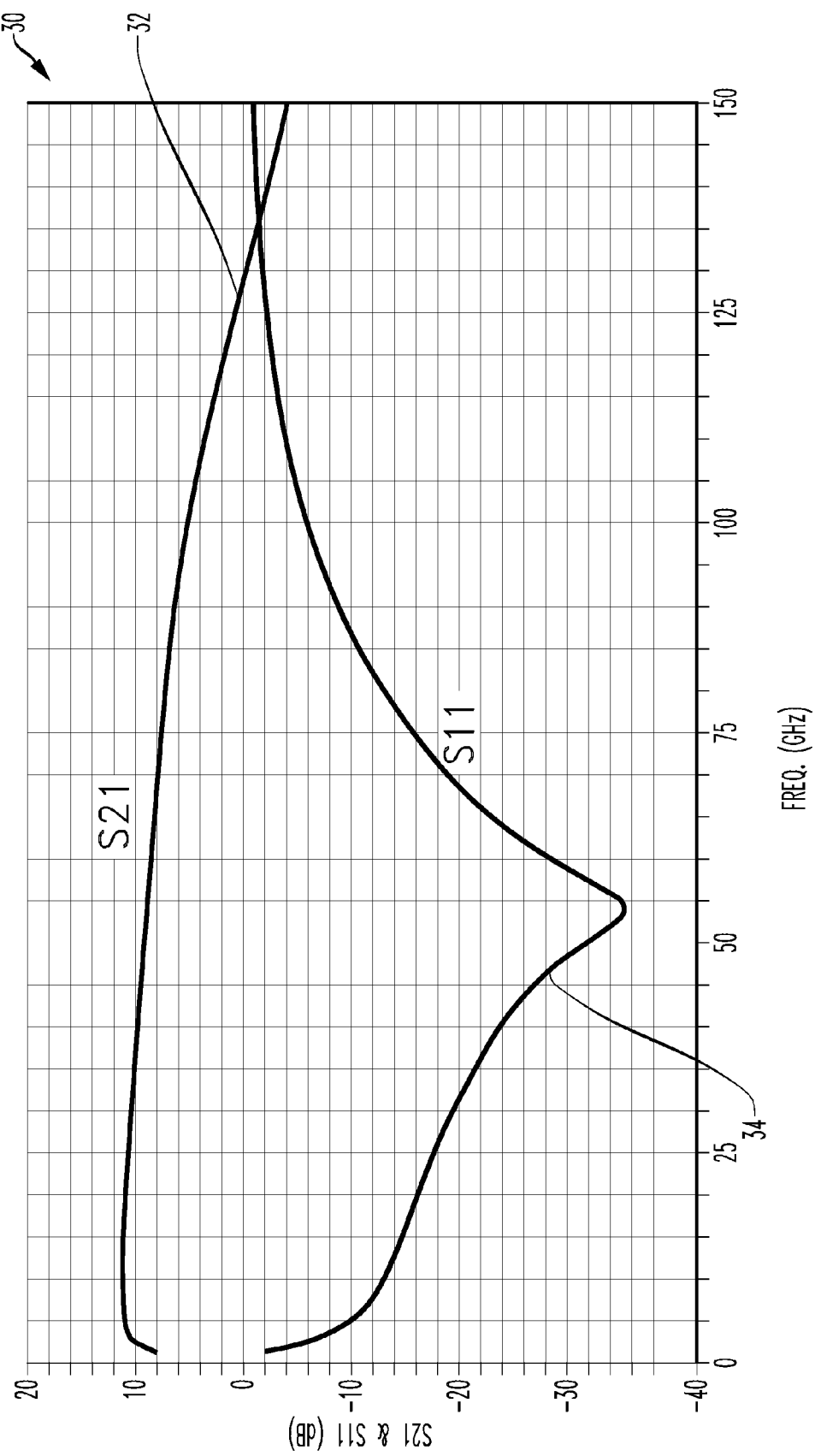
FIG. 2 is a graphical representation of the input reflection coefficient ($S_{11}$) and the forward transmission coefficient ($S_{21}$) or power gain of the known amplifier circuit of FIG. 1.

Referring now to FIG. 2, there is shown the graphical representation 30. The graphical representation 30 includes the curve 32 which represents the parameter $S_{21}$ of the amplifier circuit 10. The parameter $S_{21}$ is understood by those skilled in the art to be the forward transmission coefficient or power gain of the amplifier circuit 10. The graphical representation 30 also includes the curve 34 which represents the parameter $S_{11}$ of the amplifier circuit 10. The parameter $S_{11}$ is understood to represent the input reflection coefficient of the amplifier circuit 10.

It is well known that the $S_{21}$ curve 32 of a wide band amplifier should be as flat as possible over the frequencies covered in order to obtain the best performance of amplifiers. The bandwidth of an amplifier is usually defined as the frequency at which the gain is 3 db below its low frequency gain. Therefore, the 3db point of the $S_{21}$ curve 32 should be located at a frequency that is as high as possible. For good performance as a wide band amplifier the 3 dB point of the $S_{21}$ curve 32 of the amplifier circuit 10 should be at least 11 GHz. Additionally, for good performance the input reflection coefficient, as represented by the $S_{11}$ curve 34, should be at least 10 dB down over the entire frequency range in order to reduce the power reflection caused by the mismatch due to the input matching and the antenna.

However, the forward transmission coefficient represented by the $S_{21}$ curve 32 of the amplifier circuit 10 is a constantly declining response over the relevant frequencies, with its 3 db point occurring at approximately 9 GHz. Additionally, the 3 dB point of the $S_{11}$ curve 34 is at approximately 9 GHz. Thus, there is much room for improvement in the frequency response of the amplifier circuit 10.

Figure 3:
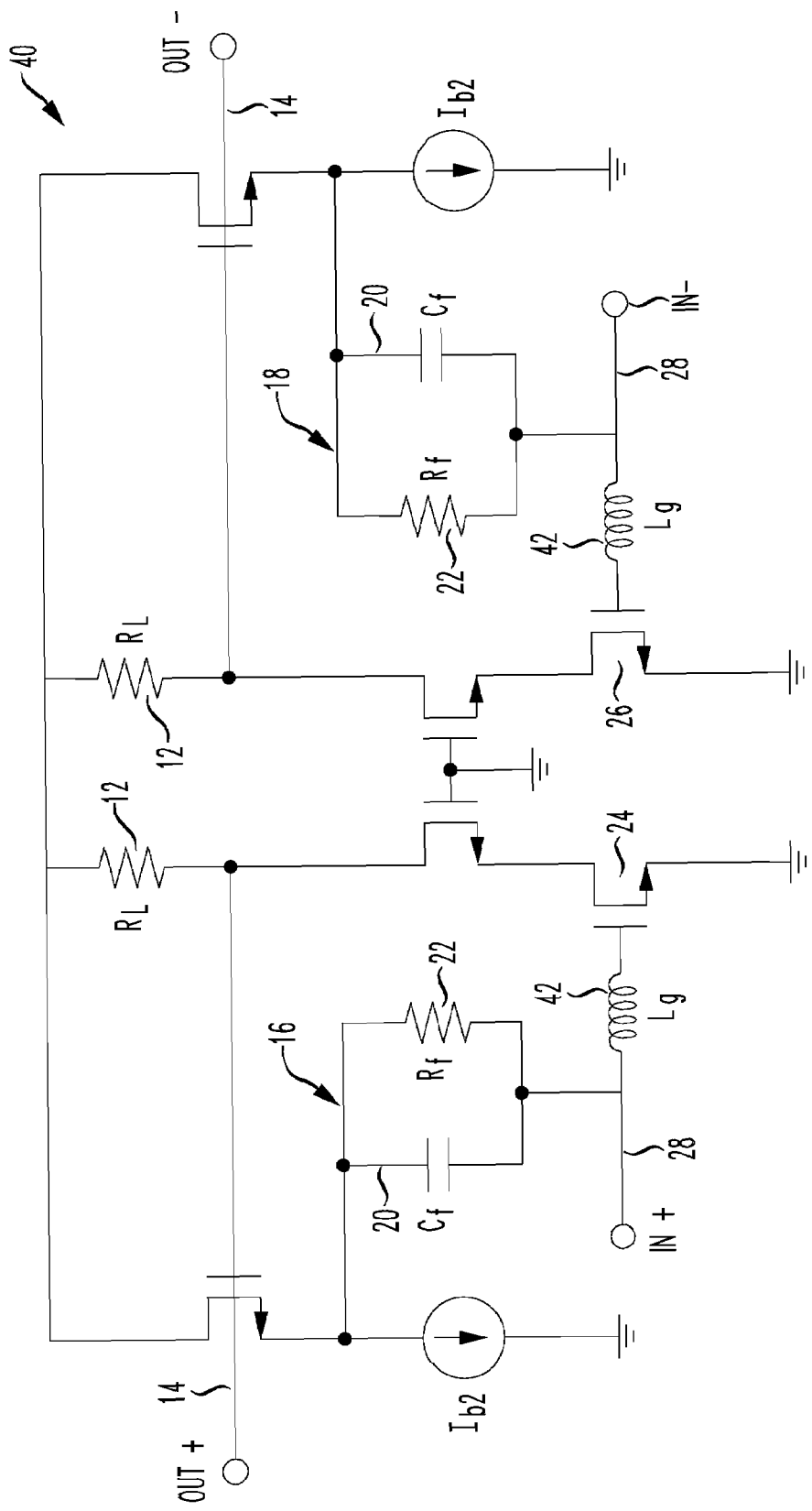
FIG. 3 is a schematic representation of an embodiment of an amplifier circuit for providing UWB low noise amplification of communications signals including an input peaking inductor according to the present invention.

Referring now to FIG. 3, there is shown an embodiment of the UWB LNA 40 of the present invention. In the UWB LNA 40 differential input signals can be received at the differential input terminals 28 and applied to the gates of the input transistors 24, 26 to provide an amplified output signal at the output terminals 14, as previously described. Additionally, the input transistors 24, 26 of the UWB LNA 40 can be provided with the feedback loops 16, 18, as previously described.

However, according to the present invention, the gates of the input transistors 24, 26 of the UWB LNA 40 are each provided with an input gate inductor 42 between the differential input terminals 28 and the gates of the transistors 24, 26. The input gate inductors 42 therefore receive the differential inputs from the differential input terminals 28 and apply them to the gates of the input transistors 24, 26. Furthermore, the input gate inductors 42 are located within the feedback loop 16, 18 when they are coupled to the feedback resistors 20, feedback capacitors 42 and the gates of the input transistors 24, 26 in this manner.

Figure 4:
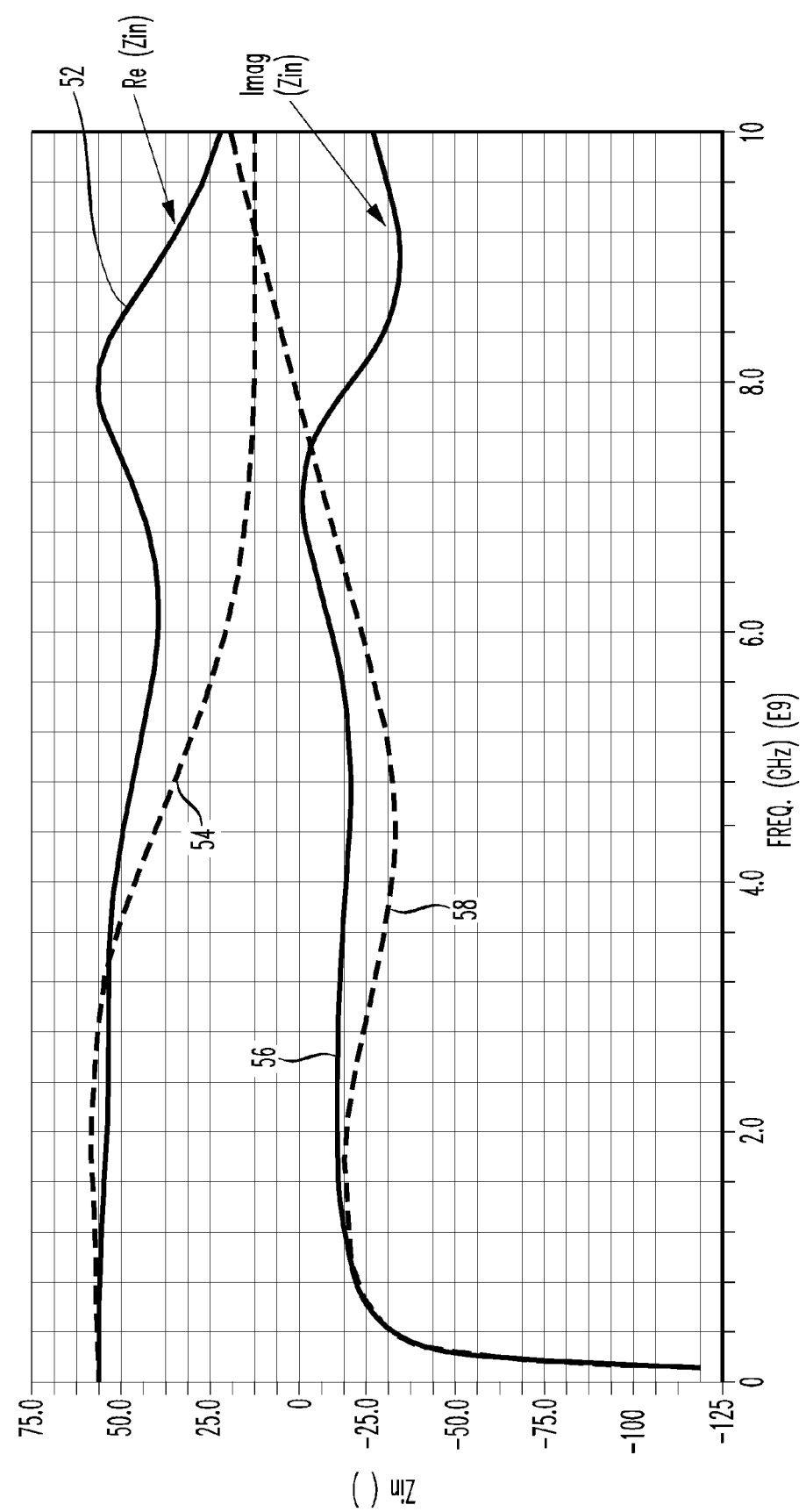
FIG. 4 is a graphical representation of the input impedance of the amplifier circuit of FIG. 3 and the input impedance of an amplifier circuit substantially similar to the amplifier circuit of FIG. 1 for comparison therewith.

Referring now to FIG. 4, there is shown the graphical representation 50. The graphical representation 50 illustrates the input impedance of the UWB LNA 40. The graphical representation 50 also illustrates the input impedance of an amplifier circuit substantially similar to the amplifier circuit 10. The impedance values shown in the representation 50 are plotted as functions of the input signal frequency of the UWB LNA 40. The real component of the input impedance of the UWB LNA 40, wherein the input gate inductors 42 are provided, is represented by the solid curve 52. The imaginary component of the input impedance is represented by the solid curve 56. The dashed curves 54, 58 of the representation 50 indicate the real and imaginary components, respectively, of the input impedance of an amplifier substantially similar to the amplifier circuit 10.

In an ideal UWB LNA circuit the real component of the input impedance should be approximately 50 ohms. Furthermore, in an ideal UWB LNA circuit the imaginary component of the input impedance should be zero. However, as shown by the dashed curves 54, 58 of the graphical representation 50 both the real and imaginary components of the input impedance of the amplifier circuit 10 are substantially degraded with respect to the ideal case. This is primarily due to the input capacitance of the amplifier circuit 10.

For example, the real component of the input impedance of the amplifier circuit 10, as represented by the curve 54, deviates from 50 ohms at approximately 3.5 GHz. However, when the input gate inductors 42 are provided in the feedback loops 16, 18, the real component of the impedance does not deviate from 50 ohms until approximately 9 GHz. Furthermore, the solid curve 56 of the UWB LNA 40 is closer to the zero line of the graphical representation 50 than the dashed curve 58 of the amplifier circuit 10. In this manner the input gate inductors 42 can improve both the real and imaginary components of the input impedance of the UWB LNS 40 to thereby improve the input impedance matching and frequency response.

Figure 5:
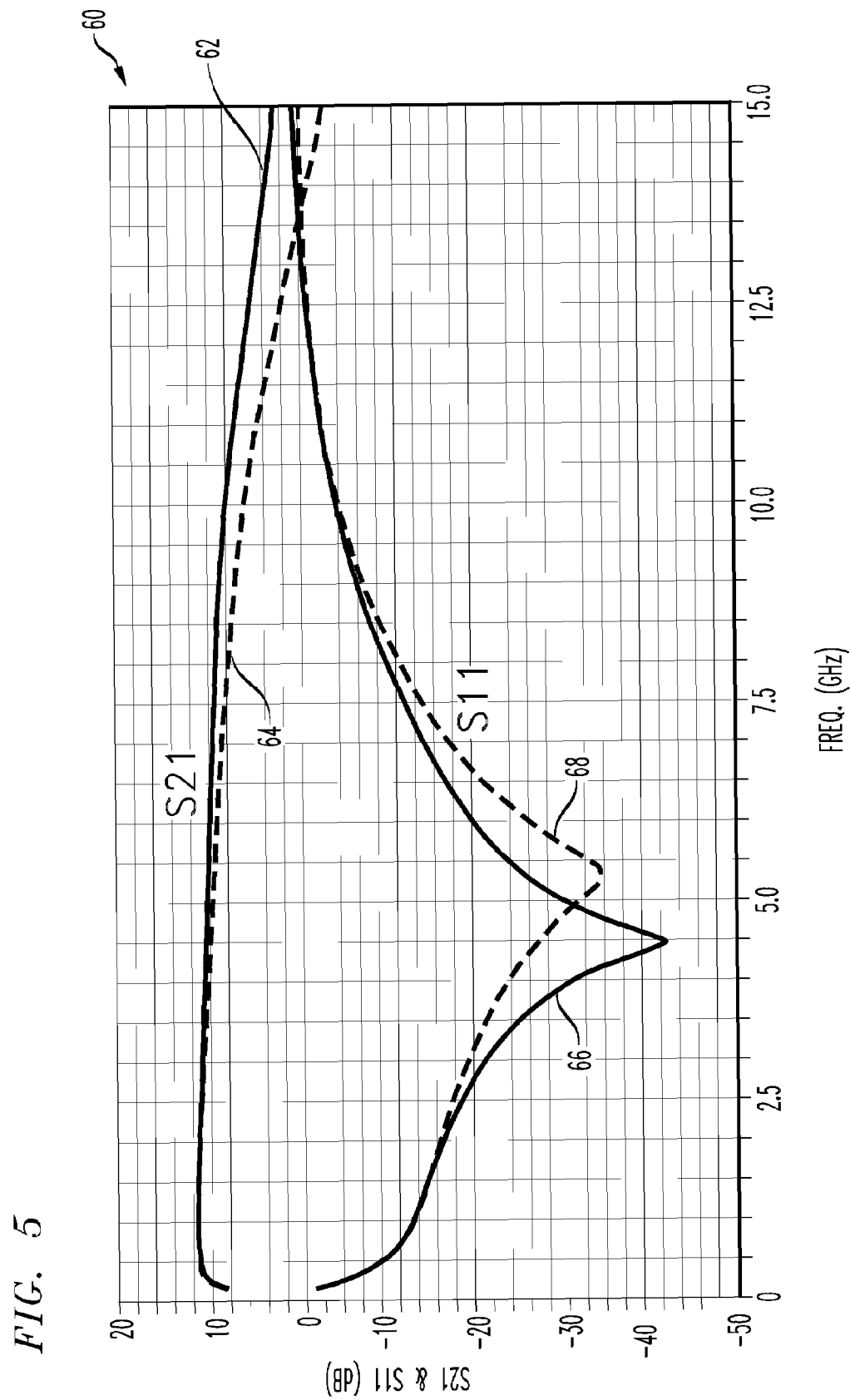
FIG. 5 is a graphical representation of the $S_{11}$ and $S_{21}$ parameters of the amplifier circuit of FIG. 3 and the $S_{11}$ and $S_{21}$ parameters of an amplifier circuit substantially similar to the amplifier circuit of FIG. 1 for comparison therewith.

Referring now to FIG. 5, there is shown the graphical representation 60. The solid curves 62, 66 of the graphical representation 60 represent the parameters $S_{21}$ and $S_{11}$, respectively, of the UWB LNA 40. The dashed curves 64, 68 represent the parameters $S_{21}$ and $S_{11}$, respectively, of an amplifier circuit substantially similar to the amplifier circuit 10. The parameters $S_{21}$ and $S_{11}$, represented by the dashed curves 64, 68 can be substantially similar to the curves 54, 58 shown in the graphical representation 30.

Thus, the solid $S_{21}$ curve 62 of the UWB LNA 40, having the input gate inductors 42, can be compared with the dashed $S_{21}$ curve 64 of the amplifier circuit, without the gate inductors 42. In this manner it is possible to determine the effect of the input gate inductors 42 in the UWB LNA 40 on the forward transmission coefficient $S_{21}$. Specifically, it can be seen that the $S_{21}$ curve 62 is flatter than the $S_{21}$ curve 64 and that the 3 dB point of the $S_{21}$ curve 62 occurs at a higher frequency than the 3 dB point of the $S_{21}$ curve 64.

Furthermore, with reference to the graphical representation 60, the solid $S_{11}$ curve 66 of the UWB LNA 40 can be compared with the dashed $S_{11}$ curve 68 of the amplifier circuit 10 to determine the effect of the input gate inductors 42 on the input reflection coefficient $S_{11}$. It can be seen from this comparison that the solid $S_{11}$ curve 66 peaks at about 8 dB lower than the dashed $S_{11}$ curve 68 and that the peak of the $S_{11}$ curve 66 is moved from approximately 5.5 GHz to approximately 4.5 GHz. Thus, both the $S_{11}$ and $S_{21}$ parameters of the UWB LNA 40 are improved by the addition of the input gate inductors 42. A typical value of the gate inductors 42 for obtaining improved results according to the method of the invention can be approximately 0.3 nH in one preferred embodiment.

While the UWB LNA 40 is taught herein as a differential amplifier having two differential input transistors 24, 26 with two input gate inductors 42, it will be understood that the input gate inductors 42 are not limited to differential amplifiers. A single input gate inductor 42 can be advantageously applied to an amplifier having a single input gate transistor in order to obtain an improved frequency response as indicated by its $S_{21}$ and $S_{11}$ parameters.

Figure 6:
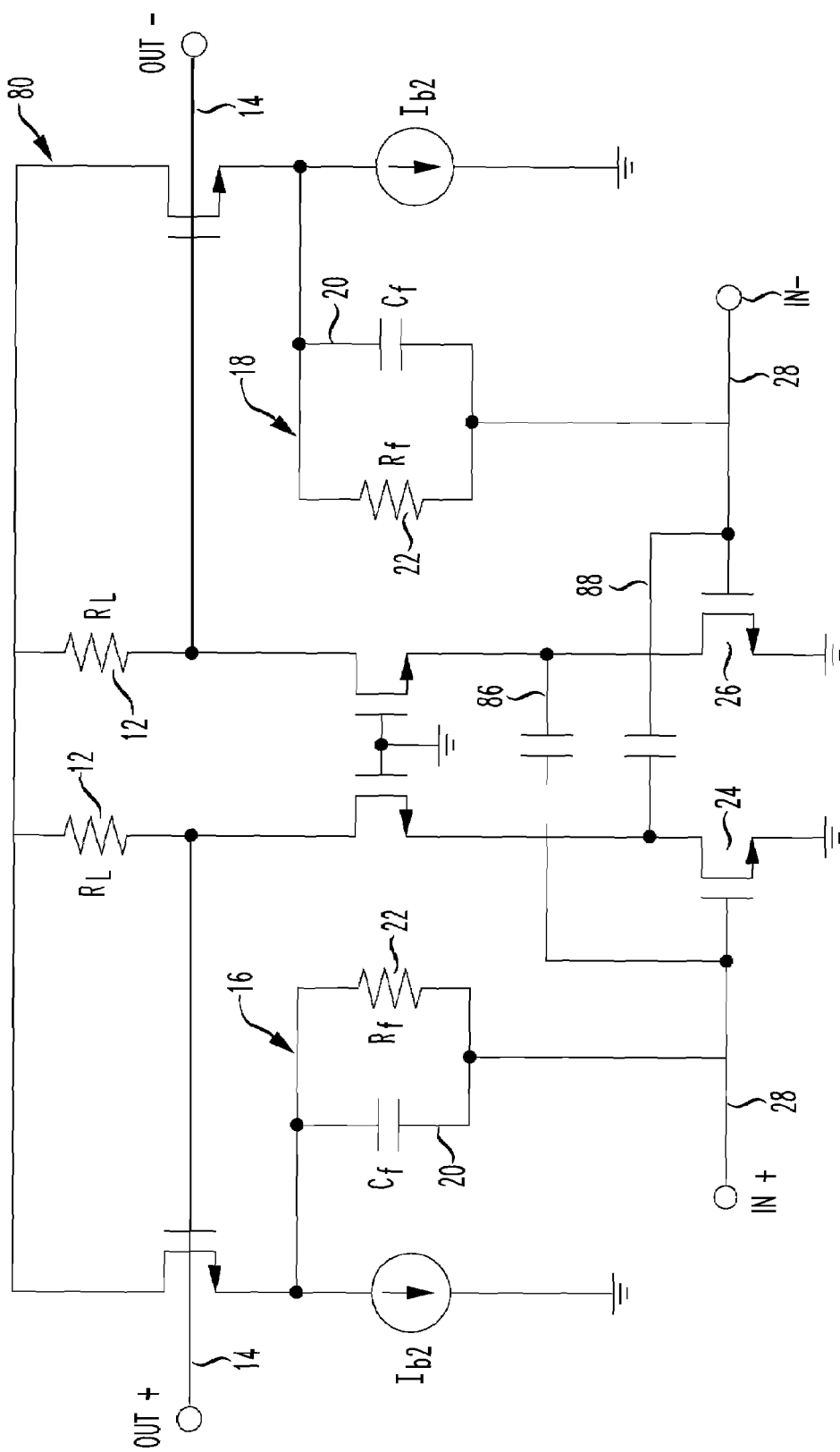
FIG. 6 is a schematic representation of an embodiment of an amplifier circuit for providing UWB low noise amplification of communications signals including the neutralizing capacitors according to the present invention.

Referring now to FIG. 6, there is shown the UWB LNA 80 of the present invention. In the UWB LNA 80 differential input signals are received at the differential input terminals 28 and applied to the gates of the input transistors 24, 26 to provide an amplified output signal at the output terminals 14, as previously described. The input transistors 24, 26 of the UWB LNA 80 are provided with feedback loops 16, 18, as also previously described.

However, according to the present invention, the neutralization capacitors 86, 88 can be added at the inputs of the UWB LNA 80 in order to provide improved frequency response. The neutralization capacitor 86 of the invention can couple the gate of the input transistor 24 to the drain of the input transistor 26. Additionally, the neutralization capacitor 88 can couple the gate of the input transistor 26 to the drain of the input transistor 24.

It is believed that the neutralization capacitors 86, 88 coupled to the input transistors 24, 26 in this manner can improve the frequency response of the UWB LAN 80 by providing improved input impedance matching. The improved input impedance matching is believed to cancel at least a portion of the parasitic gate/drain capacitance of the input transistors 24, 26 within the UWB LAN 80. Specifically, the neutralization capacitor 86 can cancel a portion of the gate/drain input capacitance of the input transistor 26, and the neutralization capacitor 88 can cancel a portion of the gate/drain capacitance of the input transistor 24. It will be understood by those skilled in the art that canceling the parasitic input capacitance of a wide band amplifier can improve its bandpass characteristics.

Figure 7:
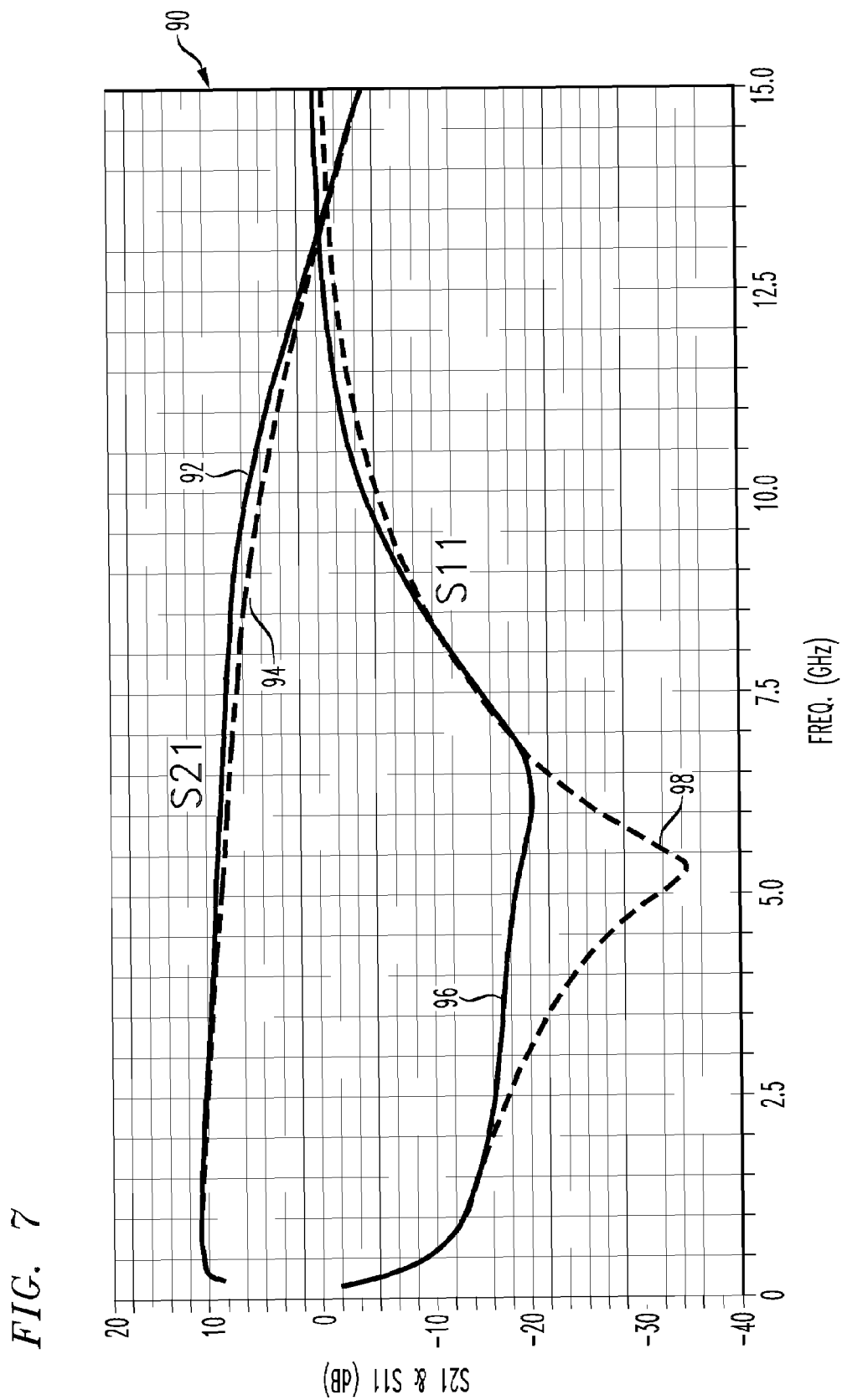
FIG. 7 is a graphical representation of the $S_{11}$ and $S_{21}$ parameters of the amplifier circuit of FIG. 6 and the $S_{11}$ and $S_{21}$ parameters of an amplifier circuit substantially similar to the amplifier circuit of FIG. 1 for comparison therewith.

Referring now to FIG. 7, there is shown the graphical representation 90. The solid curves 92, 96 of the graphical representation 90 can represent the parameters $S_{21}$ and $S_{11}$, respectively, of the UWB LNA 80. The dashed curves 94, 98, respectively, represent the parameters $S_{21}$ and $S_{11}$, of an amplifier circuit substantially similar to the amplifier circuit 10, as previously described.

Thus, the solid $S_{21}$ curve 92 of the UWB LNA 80 can be compared with the dashed $S_{21}$ curve 94 of the amplifier circuit 10. In this manner it is possible to determine the effect of adding the neutralization capacitors 86, 88 on the forward transmission coefficient of the UWB LNA 80. Specifically, it can be seen that the solid $S_{21}$ curve 92 is flatter than the dashed $S_{21}$ curve 94, and that the 3dB point of the $S_{21}$ curve 92 occurs at a higher frequency than the 3 dB point of the amplifier circuit 10. Furthermore, with reference to the graphical representation 90, the solid $S_{11}$ curve 96 of the UWB LNA 80 can be compared with the dashed $S_{11}$ curve 98 of the amplifier circuit 10 to determine the effect of the neutralization capacitors 86, 88 on the input reflection coefficient. While the $S_{11}$ curve 96 is degraded somewhat in the UWB LNA 80 it is still well below the −10 dB level required for good performance as an ultra-wide band amplifier and is therefore not significant.

Figure 8:
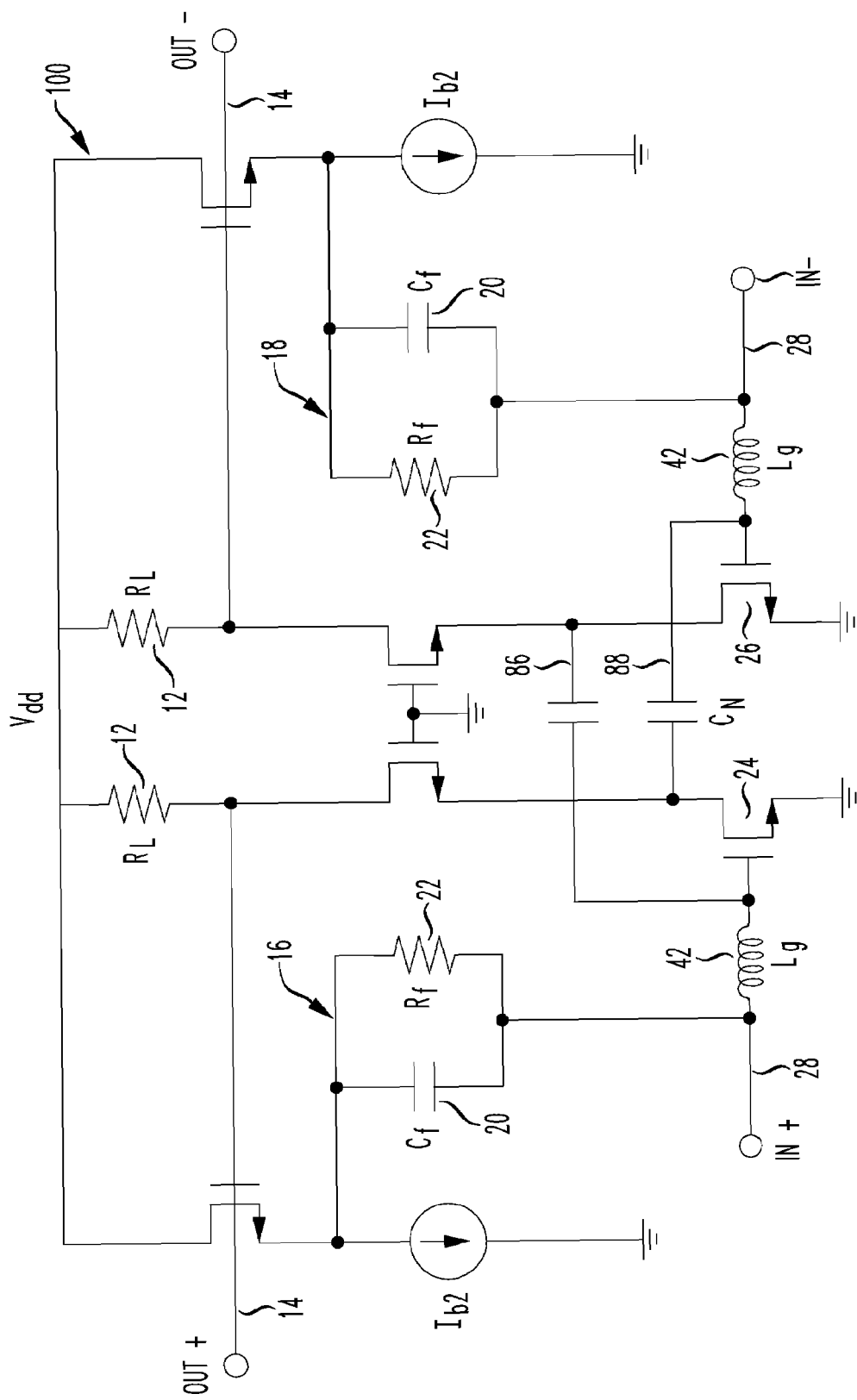
FIG. 8 is a schematic representation of an embodiment of an amplifier circuit for providing UWB low noise amplification of communications signals including both input peaking inductors and neutralizing capacitors according to the present invention.

Referring now to FIG. 8, there is shown the UWB LNA 100 of the present invention. In the UWB LNA 100 differential input signals are received at the differential input terminals 28. The differential input signals are applied to the gates of the input transistors 24, 26 to provide an amplified output signal at the output terminals 14, as previously described. Additionally, the input transistors 24, 26 of the UWB LNA 100 are provided with the feedback loops 16, 18, as also previously described.

However, according to the present invention, both the input gate inductors 42 and the neutralization capacitors 86, 88 can be provided simultaneously within the UWB LNA 100. The input gate inductors 42 can be coupled to the input terminals 28 and the gates of the input transistors 24, 26 as described with respect to the UWB LNA 40. Additionally, the neutralization capacitors 86, 88 can be coupled to the gates and drains of the input transistors 24, 26 as described with respect to the UWB LNA 80. In this manner both the input transistors 24, 26 and the neutralization capacitors 86, 88 can contribute to improving the input impedance matching and bandwidth of the UWB LNA 100.

Accordingly, as taught by the UWB LNA 100, as well as the UWB LNA 40 and the UWB LNA 80, a wideband amplifier circuit having at least one transistor can be provided with an impedance element, i.e. an inductor or capacitors, that couples the amplifier input and the amplifier output for transmitting a feedback signal between the amplifier input and the output in order to peak a frequency response of the amplifier. Those skilled in the art will understand that the feedback signal varies according to changes in the impedance of the impedance element.

Figure 9:
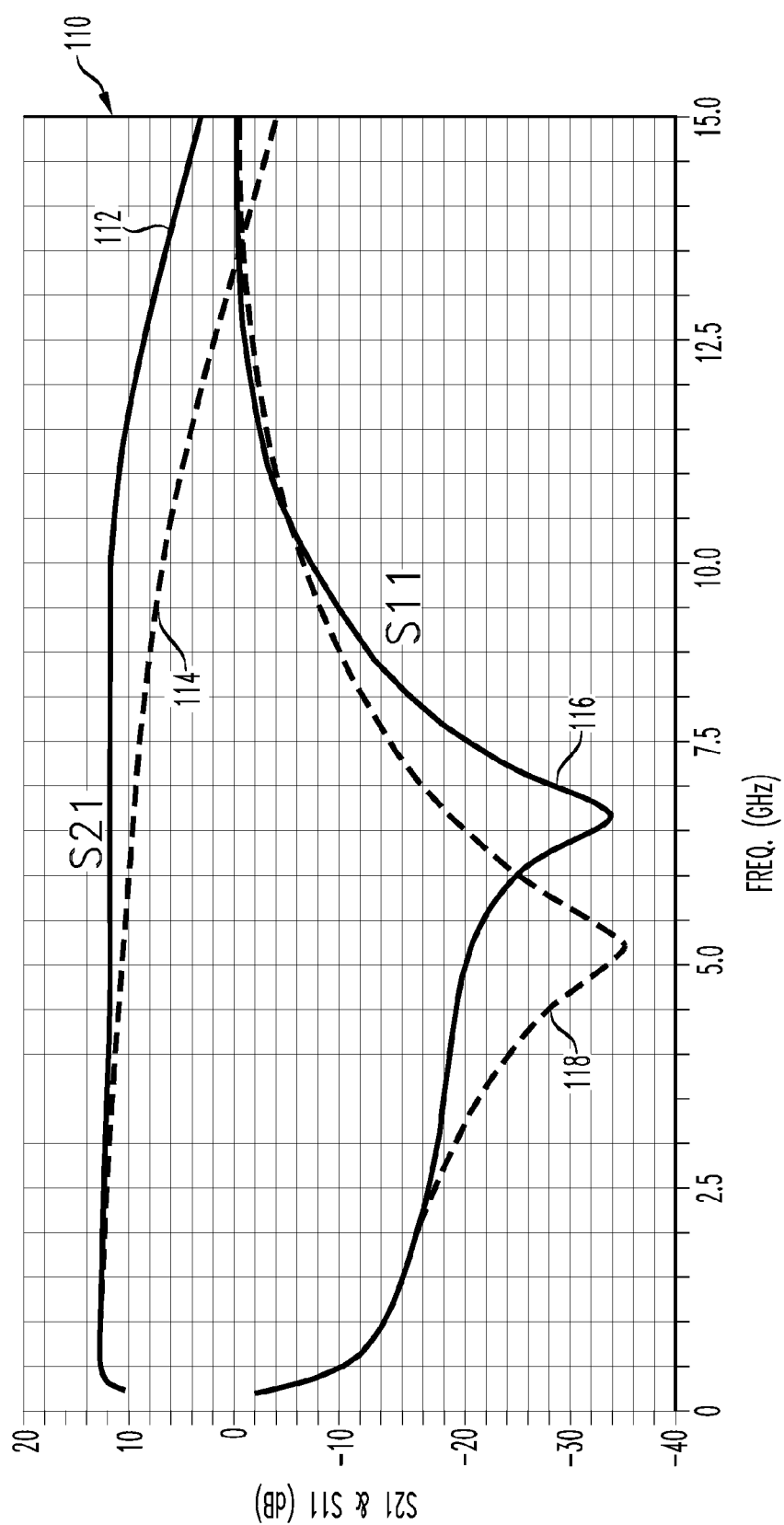
FIG. 9 is a graphical representation of the $S_{11}$ and $S_{21}$ parameters of the amplifier circuit of FIG. 8 and the $S_{11}$ and $S_{21}$ parameters of an amplifier circuit substantially similar to the amplifier circuit of FIG. 1 for comparison therewith.

Referring now to FIG. 9, there is shown the graphical representation 110. The solid curves 112, 116 of the graphical representation 110 represent the parameters $S_{21}$ and $S_{11}$, respectively, of the UWB LNA 100. The dashed curves 114, 118 of the graphical representation 110 respectively represent the parameters $S_{21}$ and $S_{11}$ of an amplifier circuit substantially similar to the amplifier circuit 10, as previously described. Thus, with reference to the graphical representation 110, the solid $S_{21}$ curve 112 of the UWB LNA 100 can be compared with the dashed $S_{21}$ curve 114 of the amplifier circuit 10.

Additionally, the solid $S_{11}$ curve 116 of the UWB LNA 100 can be compared with the dashed $S_{11}$ curve 118 of the amplifier circuit 10. In this manner it is possible to determine the effect on the frequency response of the UWB LNA 100 when both the input gate inductors 42 and the neutralization capacitors 86, 88 are added to the amplifier circuit 10.

Additionally, the solid curves 112, 116 of the representation 110 can be compared with the solid curves 62, 66 of the UWB LNA 40 as shown in the representation 60. In the representation 60 the solid curves 62, 66 represent the $S_{21}$ and $S_{11}$ parameters, respectively, of the UWB LNA 40. Such a comparison can indicate the effect of adding the neutralizing capacitors 42 to the UWB LNA 40 already including the input gate inductors 42.

Furthermore, the solid curves 112, 116 of the representation 110 can be compared with the solid curves 92, 96 of the UWB LNA 80 as shown in the graphical representation 90. In the graphical representation 90 the solid curves 92, 96 represent the frequency response of the UWB LNA 80. Such a comparison can indicate the effect of adding the input gate inductors 42 to the UWB LNA 80 already including the neutralizing capacitors 42.

For example, the 3 dB point of the solid $S_{21}$ curve 62 of the UWB LNA 40 is located at approximately 9 GHz and the 3 dB point of the solid $S_{21}$ curve 92 of the UWB LNA 80 is located at approximately 10.2 GHz. However, the 3 dB point of the solid $S_{21}$ curve 112 of the UWB LNA 100 is shifted to approximately 11.5 GHz. Thus, it can be seen that providing the input gate inductors 42 in addition to the neutralization capacitors 86, 88, provides further improvement in the frequency response of the UWB LAN 100, beyond the improvement provided by either of the foregoing additions alone.

Figure 10:
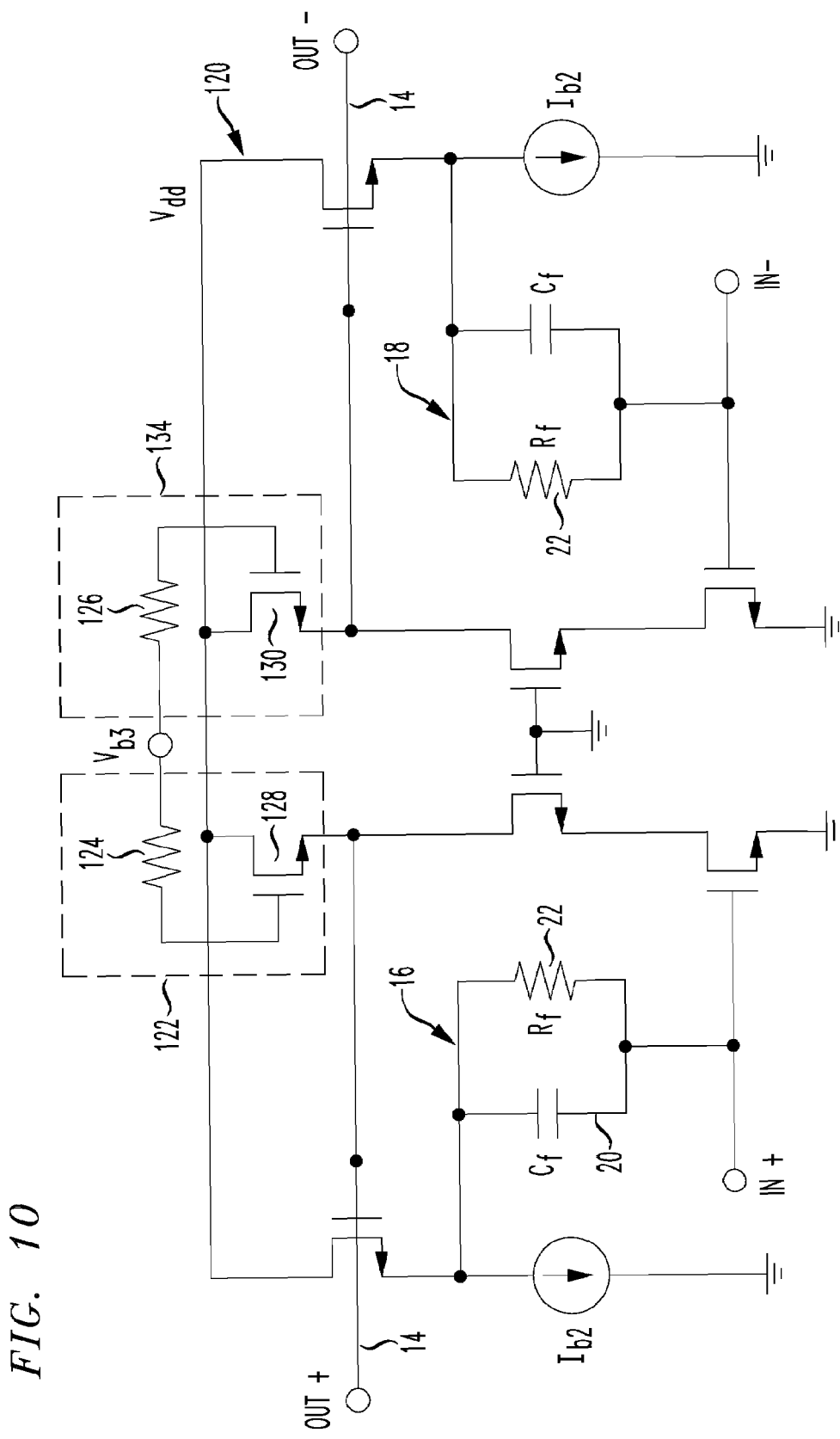
FIG. 10 is a schematic representation of an embodiment of an amplifier circuit for providing UWB low noise amplification of communications signals including an active inductor according to the present invention.
Figure 11:
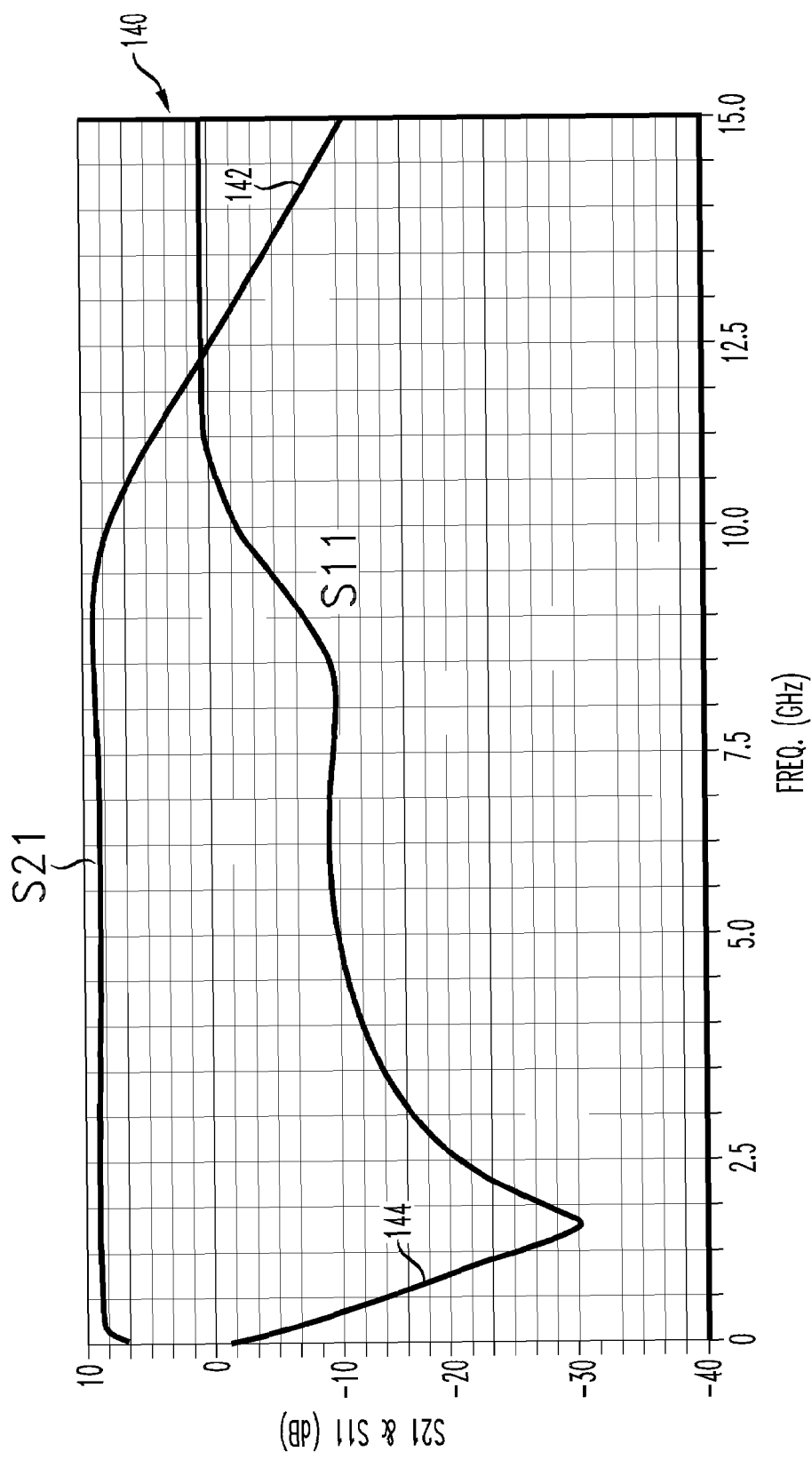
FIG. 11 is a graphical representation of the $S_{11}$ and $S_{21}$ parameters of the amplifier circuit of FIG. 10.

Referring now to FIGS. 10, 11, there are shown the UWB LNA 120 and the graphical representation 140. The UWB LNA 120 is an alternate embodiment of the system and method of the present invention wherein the active inductors 122, 134 are coupled to the differential output terminals 14. The UWB LNA 120 can provide low noise UWB amplification of RF input signals. The graphical representation 140 includes the curves 142, 144. The curves 142, 144 represent the $S_{21}$ and $S_{11}$ parameters, respectively, of the UWB LNA 120.

Accordingly, the active inductors 122, 134 can be added at the differential output terminals 14 in order to extend the bandwidth of the UWB LNA 120. As understood by those skilled in the art, the inductive impedance of the active inductor 122 is created by the small signal operation of the transistor 128 in combination with the resistor 124. Additionally, the inductive impedance of the active inductor 134 is created by the small signal operation of the output transistor 130 in combination with the resistor 126. The combination of the transistors 128, 130 and the gate resistors 124, 126 can be equivalent to a resistor and an inductor in series. The active inductors 122, 134 can also be advantageously applied to any of the UWB LNAs 40, 80 and 100 to improve their frequency response.

The presence of the active inductors 122, 134 at the output terminals 14 of the UWB LNA 120 can provide improved output impedance at higher input signal frequencies. The bandwidth of the UWB LNA 120 can thereby be extended by the active inductors 122, 134 to provide improved frequency response. For example, the 3 dB point of $S_{21}$ can be extended to approximately 10.2 GHz as shown by the curve 142 of the graphical representation 140. Furthermore, the $S_{11}$ curve 144 is below −10 dB through substantially the entire frequency range covered by the UWB LNA 120.

The UWB LNA 120 including the active inductors 122, 134 is especially well adapted for receiving and amplifying the very small RF signals received directly from antennas, for example in handheld devices. The use of the active inductors 122, 134 rather than passive inductors at the output of the UWB LNA 120 can introduce a small amount of noise into the UWB LNA 120. However, the use of the active inductors 122, 134 can substantially increase the bandwidth of the UWB LNA 120 using only a fraction of the surface area required for the passive inductors.

While the UWB LNA 120 is taught herein as an amplifier having two differential output terminals 14 and two active inductors 122, 134, it will be understood that the active inductors 122, 134 of the invention are not limited to differential output amplifiers. A single active inductor 122, 134 can be advantageously applied to an amplifier having a single output terminal in order to obtain an improved frequency response as indicated by the $S_{21}$ and $S_{11}$ parameters of the amplifier.

Thus, the system and method of the present invention includes a wideband amplifier having an amplifier input terminal and an amplifier output terminal, at least one transistor coupled to the amplifier input terminal and an impedance element coupled between the amplifier input terminal and the amplifier output terminal. A feedback signal transmitted between the amplifier output terminal and the amplifier input terminal by way of the impedance element is provided wherein the feedback signal varies in accordance with changes in an impedance of the impedance element so as to peak a frequency response of the amplifier.

Additionally, a wideband amplifier can include at least one transistor that is an input transistor having a transistor input terminal. An input inductor can be coupled to the amplifier input terminal and the transistor input terminal, and an input signal to be amplified by the amplifier is received by the amplifier input terminal. The input inductor receives the input signal from the amplifier input terminal and applies the input signal to the transistor input terminal. A transistor feedback loop is coupled to the input transistor to provide the feedback signal wherein the transistor feedback loop includes the input inductor.

The wideband amplifier can also include a differential amplifier having first and second input transistors, each of the first and second input transistors having a gate and a drain and first and second input signals to be amplified by the differential amplifier circuit wherein the first and second input signals are received by the gates of the first and second input transistors. Additionally, first and second capacitors can be included wherein each of the first and second capacitors couples the gate of one of the first and second input transistors to the drain of the other of the first and second input transistors.

Furthermore, an RF amplifier circuit having an amplifier input terminal and an amplifier output terminal can include an RF input signal to be amplified wherein the RF input signal is received by the amplifier input terminal and an amplifier RF output signal is provided at the amplifier output terminal in accordance with the RF input signal. An active inductor can be coupled to the amplifier output terminal.

The use of the foregoing inventions is not limited to amplifiers operating at UWB frequencies. For example, in a preferred embodiment of UWB LNAs such as those taught herein, 90 nm CMOS technology can be used. However, amplifiers using CMOS technologies having dimensions smaller than 90 nm can also be used to form amplifier circuits. Amplifier circuits formed in this manner can operate at even higher frequencies than the LNAs set forth herein. It will be understood that any of the embodiments of the invention taught herein can be advantageously applied to such higher frequency amplifiers.

The present invention has been described with references to the enclosed figures and description. It is to be appreciated that the true spirit and scope of the invention is to be determined with reference to the attached claims.

What is claimed is:

1. A wideband amplifier having an amplifier input terminal and an amplifier output terminal, comprising:
   at least one transistor coupled to said amplifier input terminal;
   at least first and second impedance elements coupled between said amplifier input terminal and said amplifier output terminal; and
   a feedback signal path comprising the at least first and second impedance elements and operative to convey a feedback signal transmitted between said amplifier output terminal and said amplifier input terminal by way of said first and second impedance elements, wherein said feedback signal varies in accordance with changes in an impedance of each of said first and second impedance elements as a function of a frequency of an input signal applied to the amplifier input terminal, a value of each of said first and second impedance elements being adapted so as to peak a frequency response of said amplifier;
   wherein said at least one transistor comprises an input transistor having a transistor input terminal, wherein the amplifier further comprises a transistor feedback loop coupled to said input transistor to provide said feedback signal, said feedback loop comprising a feedback resistor and a feedback capacitor, said feedback resistor and said feedback capacitor being coupled in parallel with each other.

2. The wideband amplifier of claim 1, wherein:
   at least one of the first and second impedance elements comprises an input inductor coupled to said amplifier input terminal and said transistor input terminal, said input inductor receiving, from said amplifier input terminal, an input signal to be amplified by said amplifier and applying said input signal to said transistor input terminal; and
   wherein said transistor feedback loop includes said input inductor.

3. The amplifier circuit of claim 2, wherein said input inductor is coupled in series with said parallel resistor and said capacitor.

4. The amplifier circuit of claim 1, wherein said transistor feedback loop provides input impedance matching for said amplifier circuit.

5. The amplifier circuit of claim 1, further comprising:
   a differential amplifier circuit having first and second amplifier input terminals;
   first and second input signals to be amplified by said differential amplifier circuit wherein said first and second input signals are received by said first and second amplifier input terminals; and
   first and second input transistors including respective first and second transistor input terminals.

6. The amplifier circuit of claim 5, further comprising first and second input inductors coupled to said first and second amplifier input terminals and to said first and second transistor input terminals wherein said first and second input signals are received from said first and second amplifier input terminals and applied to said first and second transistor input terminals by said first and second input inductors.

7. The amplifier circuit of claim 6, further comprising first and second feedback loops coupled to said first and second input transistors to provide transistor feedback for said first and second input transistors.

8. The amplifier circuit of claim 7, wherein said first and second feedback loops each comprise one of said first and second input inductors.

9. The amplifier circuit of claim 6, wherein said first and second input transistors have parasitic capacitance and said first and second input inductors cancel at least a portion of said parasitic input capacitance.

10. The amplifier circuit of claim 2, further comprising increased bandwidth in accordance with said input inductor.

11. The amplifier circuit of claim 10, wherein said increased bandwidth comprises an increased forward transmission coefficient of said amplifier circuit.

12. The amplifier circuit of claim 1, wherein said amplifier circuit includes an amplifier output terminal further comprising an active inductor coupled to said amplifier output terminal.

13. The amplifier circuit of claim 6, wherein said differential amplifier circuit includes first and second amplifier output terminals further comprising first and second active inductors coupled to said first and second amplifier output terminals.

14. The amplifier circuit of claim 1, further comprising an antenna wherein said antenna receives said input signal and applies said input signal to said amplifier input terminal.

15. A wideband amplifier having an amplifier input terminal and an amplifier output terminal, comprising:
   at least one transistor coupled to said amplifier input terminal;
   an impedance element coupled between said amplifier input terminal and said amplifier output terminal; and
   a feedback signal transmitted between said amplifier output terminal and said amplifier input terminal by way of said impedance element wherein said feedback signal varies in accordance with changes in an impedance of said impedance element so as to peak a frequency response of said amplifier;
   the amplifier further comprising a differential amplifier circuit having first and second amplifier input terminals adapted to receive first and second input signals, respectively, to be amplified by said differential amplifier circuit; and
   first and second input transistors including first and second transistor input terminals, respectively;
   wherein said first and second input transistors each have a gate and a drain further comprising first and second capacitors wherein each of said first and second capacitors couples said gate of one of said first and second input transistors to said drain of the other of said first and second input transistors.

16. The amplifier circuit of claim 15, wherein said first and second input transistors have gate/drain parasitic capacitance and said first capacitor is coupled to said gate of said first input transistor and to said drain of said second input transistor and said first capacitor cancels at least a portion of said gate/drain parasitic capacitance of said second input transistor.

17. The amplifier circuit of claim 15, wherein said differential amplifier circuit includes first and second output amplifier terminals further comprising first and second active inductors coupled to said first and second amplifier output terminals.

18. A wideband amplifier having an amplifier input terminal and an amplifier output terminal, comprising:
at least one transistor coupled to said amplifier input terminal;
an impedance element coupled between said amplifier input terminal and said amplifier output terminal;
a feedback signal transmitted between said amplifier output terminal and said amplifier input terminal by way of said impedance element wherein said feedback signal varies in accordance with changes in an impedance of said impedance element so as to peak a frequency response of said amplifier;
a differential amplifier having first and second input transistors each of said first and second input transistors having a gate and a drain;
first and second input signals to be amplified by said differential amplifier circuit wherein said first and second input signals are received by said gates of said first and second input transistors; and
first and second capacitors wherein each of said first and second capacitors couples said gate of one of said first and second input transistors to said drain of the other of said first and second input transistors.

19. The differential amplifier circuit of claim 18, wherein said first and second input transistors comprise parasitic input capacitance and said first and second capacitors cancel at least a portion of said parasitic input capacitance.

20. The differential amplifier circuit of claim 19, wherein said parasitic input capacitance comprises parasitic gate/drain capacitance.

21. The differential amplifier circuit of claim 20, wherein said first capacitor is coupled to said gate of said first input transistor and to said drain of said second input transistor.

22. The differential amplifier circuit of claim 21, wherein said first capacitor cancels at least a portion of said gate/drain parasitic capacitance of said second input transistor.

23. The differential amplifier circuit of claim 21, wherein said second capacitor is coupled to said gate of said second input transistor and to said drain of said first input transistor.

24. The differential amplifier circuit of claim 23, wherein said second capacitor cancels at least a portion of said gate/drain parasitic capacitance of said first input transistor.

25. The differential amplifier circuit of claim 18, further comprising first and second feedback loops coupled to said first and second input transistors.

26. The differential amplifier circuit of claim 25, wherein each of said first and second feedback loops comprises a feedback resistor.

27. The differential amplifier circuit of claim 26, wherein each of said first and second feedback loops comprises a feedback capacitor.

28. The differential amplifier circuit of claim 27, wherein each of said first and second feedback loops comprises said feedback resistor and said feedback capacitor coupled in parallel with each other.

29. The differential amplifier circuit of claim 18, further comprising a first input inductor coupled to said gate of said first input transistor wherein said first input signal is applied to said first input transistor by way of said first input inductor.

30. The differential amplifier circuit of claim 29, further comprising a second inductor coupled to said gate of said second input transistor wherein said second input signal is applied to said second input transistor by way of said second input inductor.

31. The differential amplifier circuit of claim 30, further comprising first and second feedback loops coupled to said first and second input transistors to provide transistor feedback for said first and second input transistors.

32. The differential amplifier circuit of claim 31, wherein said first and second feedback loops comprise said first and second input inductors.

33. The differential amplifier circuit of claim 18, wherein said amplifier includes an amplifier output terminal further comprising an active inductor coupled to said amplifier output terminal.

34. The differential amplifier circuit of claim 30, wherein said amplifier includes an amplifier output terminal further comprising an active inductor coupled to said amplifier output terminal.

35. The differential amplifier circuit of claim 18, further comprising an antenna wherein said antenna receives said first and second input signals and applies said first and second input signals to said first and second input transistors.

* * * * *